United States Patent [19]

Matsumura et al.

[11] Patent Number: 4,886,971
[45] Date of Patent: Dec. 12, 1989

[54] ION BEAM IRRADIATING APPARATUS INCLUDING ION NEUTRALIZER

[75] Inventors: Yasushi Matsumura; Akira Shuhara; Shigeo Sasaki; Kazumi Fukumoto; Hitoshi Takeya, all of Hyogo, Japan

[73] Assignee: Mitsubishi Denki Kabushiki Kaisha, Tokyo, Japan

[21] Appl. No.: 165,957

[22] Filed: Mar. 9, 1988

[30] Foreign Application Priority Data

| Mar. 13, 1987 | [JP] | Japan | 62-59522 |
| Mar. 13, 1987 | [JP] | Japan | 62-59523 |
| Mar. 17, 1987 | [JP] | Japan | 62-62896 |
| Mar. 17, 1987 | [JP] | Japan | 62-62900 |
| Mar. 17, 1987 | [JP] | Japan | 62-39686[U] |

[51] Int. Cl.$^4$ .................. H01J 37/00; G21K 5/00
[52] U.S. Cl. ...................... 250/492.2; 250/492.3; 250/398; 250/281; 250/423 R; 250/309; 315/111.81; 313/359.1; 313/341
[58] Field of Search .......... 250/423 R, 492.2, 492.21, 250/492.3, 398, 309, 281, 251; 315/111.81; 313/359.1, 341, 343

[56] References Cited

U.S. PATENT DOCUMENTS

| 4,039,699 | 8/1977 | Morimoto et al. | 250/492.3 |
| 4,062,484 | 12/1977 | Rausch et al. | 226/196 |
| 4,082,938 | 4/1978 | Shergov et al. | 313/337 |
| 4,193,013 | 3/1980 | Futamoto et al. | 313/341 |
| 4,347,621 | 8/1982 | Dow | 376/141 |
| 4,361,762 | 11/1982 | Douglas | 250/492.21 |
| 4,503,329 | 3/1985 | Yamaguchi et al. | 250/309 |
| 4,620,102 | 10/1986 | Watanabe et al. | 250/427 |
| 4,684,848 | 8/1987 | Kaufman et al. | 315/111.91 |
| 4,712,366 | 12/1987 | Tsujimoto et al. | 57/245 |
| 4,825,087 | 4/1989 | Renau et al. | 250/423 R |

FOREIGN PATENT DOCUMENTS 59-204230 11/1984 Japan .

Primary Examiner—Carolyn E. Fields
Assistant Examiner—John A. Miller
Attorney, Agent, or Firm—Lowe, Price, LeBlanc, Becker & Shur

[57] ABSTRACT

In an ion beam irradiating apparatus, a specified ion beam is first deflected in a deflection direction perpendicular to an ion beam orbit by an ion beam deflector. The deflected ion beam is neutralized by a thermoelectron beam emitted from a filament of an ion neutralizer. An electrode is employed to control the supply of the thermoelectron beam to the deflected ion beam. Both the filament and control electrode elongated along the deflection direction surround the deflected ion beam traveled along the ion beam orbit.

17 Claims, 18 Drawing Sheets

ION BEAM 56

FIG. 25A
FIG. 25B
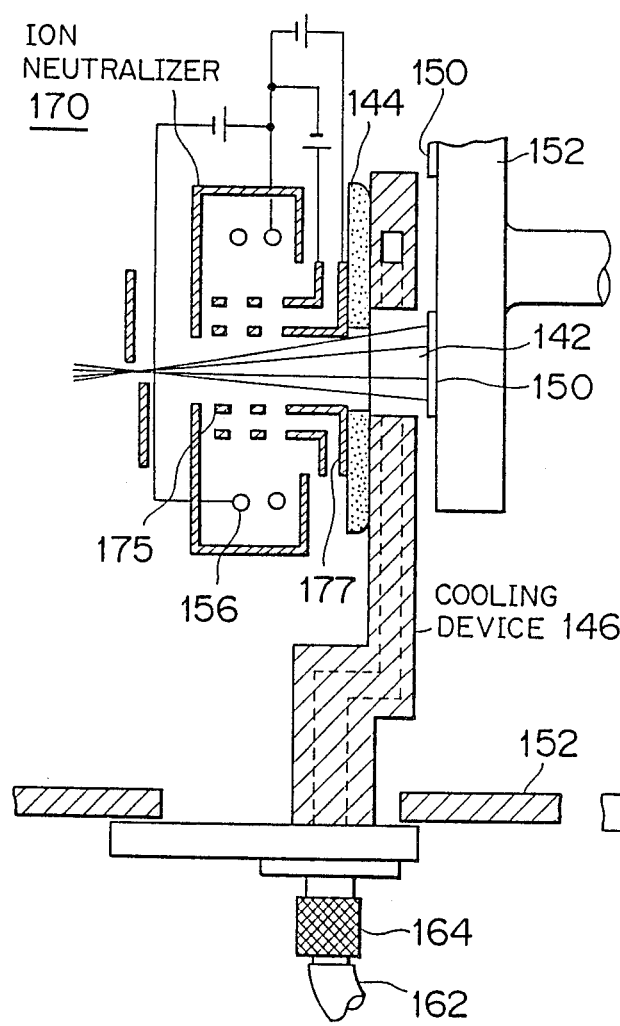
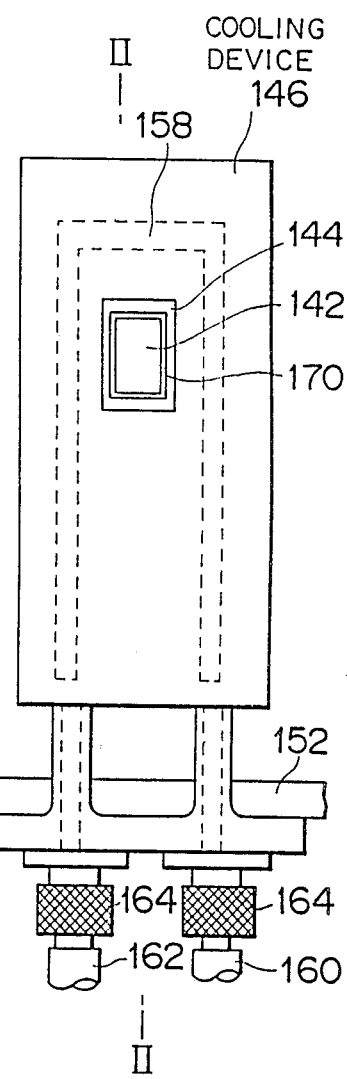

ION BEAM IRRADIATING APPARATUS INCLUDING ION NEUTRALIZER

BACKGROUND OF THE INVENTION

1. Field of the Invention

The present invention relates to an ion beam irradiating apparatus including an ion beam neutralizer.

2. Description of the Related Art

A typical ion beam irradiating apparatus employing an ion beam neutralizer to neutralize the charge of an atomic or molecular ion beam, will now be explained with reference to FIG. 1.

An ion beam irradiating apparatus, shown in FIG. 1, includes an ion source 1 an ion beam drawing electrode 2, a decelerating electrode 3, a mass separator 4, an aperture 5, an ion beam neutralizer 6, and a sample 7. The ion source 1 is usually of a type utilizing the impact of thermoelectrons against a gas, and an ion beam generated from this source is drawn out by the ion beam drawing electrode 2. Then, the ion beam passes through the ion beam decelerating electrode 3 and at this electrode ion energy is controlled.

The ions generated from the ion source 1 consist of those of univalent to tetravalent or pentavalent, and a specified type of ion is selected during passage through the mass separator 4. The mass-separated ion beam 9 finally collides against the sample 7 and reforms it. The aperture 5 controls the quantity of the ion beam 9.

Because an ion beam consists of charged particles and secondary electrons are emitted when the beam impacts against a sample, if the degree of electrical insulation of the sample is high, the potential of the, sample is increased and a dielectric breakdown may occur. In the ion beam irradiating apparatus, a neutralizer 6 controlling the potential of the sample is employed to prevent the dielectric breakdown.

FIG. 2 is a block diagram of a conventional ion beam neutralizer 6.

In FIG. 2, the neutralizer 6 includes a thermoelectron emitting source 11, (e.g. a filament), and a thermoelectron controlling means 12 for controlling the emission quantity of thermoelectrons to be supplied to the ion beam 9 provided between the ion beam trajectory, or orbit, and the filament 11. Filament 11 may be an electron drawing electrode, e.g. an electrode of grating structure enabling thermoelectrons to pass through it. An electron shower 13 is indicated by dotted lines. An electric power supply 14 is used for heating, and there is a drawing electrode 15. Following are explanations on the ion neutralization operation of the apparatus.

To facilitate the emission of thermoelectrons, the surface temperature of the filament 11 is raised to 2,000 to 2,500° C. with supply 14. Next, when a positive potential in comparison with that of the filament 11 is applied to the drawing electrode 12, thermoelectron emission begins and the electron shower is formed. These thermoelectrons collide with the ion beam 9 or flow into the sample 7, so that the sample 7 is prevented from a potential increase.

In the Japanese Patent KOKAI (Disclosure) No. 59-204230, another neutralizer as shown in FIG. 3 is disclosed.

This ion beam neutralizer includes a drift tube 21, a filament 22 arranged in the drift tube 21, an alternating current (AC) power supply 23 to heat the filament 22, a power supply 24 to apply an accelerating voltage to the drift tube 21, a power supply 25 to apply a decelerating voltage to the drift tube 21, and an ion beam 26. As shown in FIG. 3, the ion beam 26 flowing into the drift tube 21 is accelerated or decelerated by the electric field of the drift tube 21. Next, this ion beam 26 is neutralized during passage through the filament 22 which emits thermoelectrons heated by the alternating current power supply 23, and flows out of the drift tube 21 as a neutral beam.

The conventional neutralizing apparatus constructed as described above have the following various problems. The filament 22 is usually made of a thin rod of 0.5 to 1.0 mm in a diameter wound in spiral, and is supported at only two places in the filament leading-out portion. Therefore, when the filament 22 is heated up to about 3,000° C., it thermally deforms, resulting in undesirable enlargement in diameter or unevenness in winding pitches causing difficulties in controlling the degree of neutralizing effect. The distance measured from the filament 22 to the ion beam 26 is constant for an ion beam with a circular cross-section, so that uniform neutralization is effectively performed, whereas for an ion beam with a semicircular or a triangular cross-section, the distance between the filament 22 and the beam 26 unevenly varies and, therefore, uniform neutralization cannot be obtained. It also makes the control of neutralization difficult, so that this is another problem in a conventional neutralizer.

Other conventional ion beam irradiating apparatus as shown in FIG. 4 and FIG. 5 have been proposed.

One ion beam irradiating apparatus as shown in FIG. 4 includes an ion source 31, ion drawing electrode 32, a decelerating electrode 33, a mass separator 34, a deflector 35, an ion beam neutralizer 36, a sample 37, and a rotating table 38 rotatable in the direction of an arrow "A" for holding a sample such as a large diameter wafer. Reference numeral 41 is a thermoelectron emitter, for example, a filament made of a tungsten wire. Reference numerals 42 and 43 are electrodes for forming a thermoelectron control means and are arranged on concentric circles centering an ion beam trajectory. The electrode 42 is arranged between the ion beam trajectory and the filament 41 and controls the emission quantity of thermoelectrons to be supplied to the ion beam. The electrode 43 is arranged between the ion beam trajectory and the electrode 42 so as to control the energy of thermoelectrons. These electrodes are formed into, for example, grating structures enabling electrons to pass therethrough. Reference numeral 44 shows the emitted electron shower. As an ion source 31, a type utilizing the impact of thermoelectrons against a gas is generally used and the ions generated from this source are drawn out by the ion drawing electrodes 42. They then pass through the decelerating electrode 43. The ions generated from the ion source 31 consist of those of univalent to tetravalent or pentavalent and a kind of ions is selected out of them when theY pass the mass separator 34 and other ions are rejected from the ion beam trajectory. Further, the ion beam deflected in the direction of an arrow "B" by the deflector 35 is neutralized by passing through the neutralizer 36 to collide against the specimen 37 held on the rotating table 38. The sample 37 is held on the rotating table 38 rotating at a high speed, so that when the beam is deflected to one direction by the deflector 35 the beam can irradiate the whole surface of the sample 37. The colliding ion beam contributes to surface reformation or film formation.

FIG. 5 shows a longitudinal cross-sectional view taken along the line 4—4 of the neutralizer 36.

Now, by reasons that an ion beam consists of charged particles and secondary electrons are emitted when they collide against the sample 37, if the degree of insulation of the sample 37 is high, the potential of the sample is raised and dielectric breakdown may be induced. In this conventional ion-beam irradiating apparatus, the neutralizer 36 for controlling the potential of the sample 37 is employed to prevent dielectric breakdown.

The explanations for the ion neutralization operation of the neutralizer 36 will now be made in the following.

At first, the surface temperature of the filament 41 is increased up to 2,000 to 2,500° C. to facilitate emission of thermoelectrons. Next, when a positive potential in comparison with that of the filament 41 is applied to the electrodes 42 and 43, the emission of thermoelectrons is started and the electron shower 44 is formed. The difference between electrodes 42 and 43 is that the electrode 42 located close to the filament 41 can change the electric field intensity adjacent to the filament 41, to control the quantity of the electron shower. On the other hand, the electrode 43 located close to the ion beam can change the electric potential distribution in the ion-beam passing region as the ion beam passes through the neutralizer 36, to control the energy intensity of the electron shower.

The electron shower 44 collides with the ion beam or flows into the sample 37, so that the potential rise of the sample 37 can be avoided.

In the case of a conventional ion beam irradiation apparatus as shown in FIG. 5, electrodes 42 and 43 are positioned on concentric circles centering the ion beam. If the inner diameters of electrodes 42 and 43 are made large enough, the control of the potential distribution along the axis becomes difficult, so that the inner diameters cannot be freely enlarged. Therefore, the inner diameter is generally designed to be several times as large as that of the ion beam. Because of this fact, if the ion beam is deflected in the direction of the arrow B more than a normal value even in a small quantity, then the beam impinges on the electrode 43 giving damage and spattering to it. Generally, the electrode, 43 is formed by heavy metal such as tungsten or tantalum, and there is another problem that the sample is polluted by the heavy metal.

To prevent such a spattering, a smaller deflection angle by deflector 35 is preferable, but if the deflection angle is made smaller, the distance between the sample 37 and the neutralizer 36 needs to be larger to make the deflection distance uniform. It results in making the ion beam irradiating apparatus itself large.

As described above, the conventional ion beam irradiating apparatuses have many problems in irradiating samples especially having large diameters.

SUMMARY OF THE INVENTION

The present invention has been made to solve these conventional problems, and has therefore a primary object to obtain a filament having great resistibility against thermal deformation and to facilitate the control of neutralization of an ion beam.

A secondary object of the present invention is to provide an ion beam irradiation apparatus enabling to have a large deflection angle and preventing pollution by heavy metal or damage of an electrode even in the case of a large diameter sample without increasing the size of the ion beam irradiating apparatus.

The above-described objects of the invention are realized by providing an ion beam irradiating apparatus comprising:

generating means (1) for generating ion beams;

accelerating means (10) for accelerating the ion beams emitted from the generating means (1);

selecting means (4) for selecting a specified ion beam (56;60) from the accelerated ion beams;

a sample (7) receiving the specified ion beam (56;60) derived from the selecting means (4); and, an ion neutralizer means (6) positioned between the selecting means (4) and the sample (7), and including:

filament means for emitting a thermoelectron beam so as to neutralize the specified ion beam (56;60), said filament means being subdivided into a plurality of filament elements (57) which surround the specified ion beam (56;60) substantially equidistant from the specified ion beam (56;60).

Furthermore, an ion beam irradiating apparatus according to the invention comprises:

generating means (31) for generating ion beams;

accelerating means (32) for accelerating the ion beams generated from the generating means (31);

selecting means (34) for selecting a specified ion beam (75) from the accelerated ion beams;

a sample (37) receiving the specified ion beam (75) derived from the selecting means (34) and traveled along an orbit thereof;

ion deflecting means (35) positioned between the selecting means (34) and the sample (7), for deflecting the specified ion beam (75) in a deflection direction (D) perpendicular to the orbit of the ion beam (75); and ion neutralizer means (70;76) positioned between said ion deflecting means (35) and said sample (37), and including:

a thermoelectron beam emitting source (71) sandwiching said orbit of the specified ion beam (75) and elongated along the deflection direction (D) normal to said ion beam orbit; and thermoelectron supply controlling means (72) positioned between said thermoelectron beam emitting source (71) and said ion beam orbit, and elongated along the deflection direction (D), for controlling supply of the thermoelectron beam emitted from the thermoelectron beam emitting source (71) to the specified ion beam (75) so as to neutralize the specified ion beam (75) traveled along the ion beam orbit.

BRIEF DESCRIPTION OF THE DRAWINGS

For a better understanding of the present invention, reference is made to the following description and drawings, in which:

FIGS. 25A, 25B schematically illustrate a modified ion neutralizer according to the fifth preferred embodiment of the invention.

DESCRIPTION OF THE PREFERRED EMBODIMENTS SEPARATED FILAMENT ASSEMBLY OF ION NEUTRALIZER

Referring now to FIGS. 6 to 9, an ion neutralizer employing a separated filament assembly according to a first preferred embodiment will be described.

Figure 6:
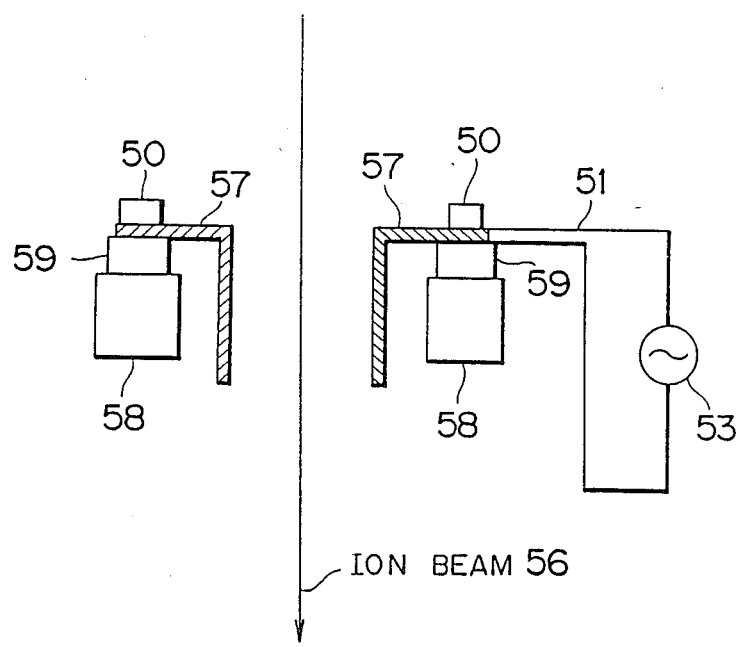
FIG. 6 schematically shows a separated filament assembly of an ion neutralizer according to a first preferred embodiment of the invention.
Figure 7:
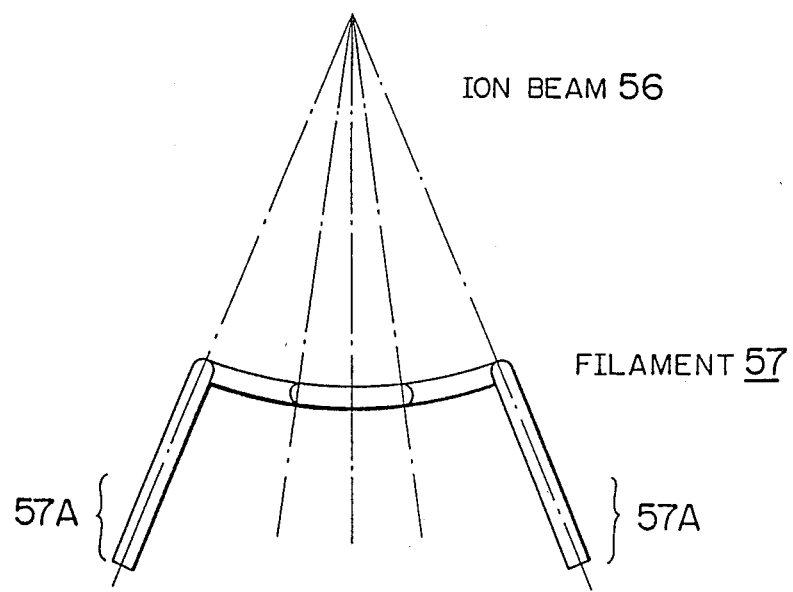
FIG. 7 is a plan view of the filament shown in FIG. 6.
Figure 8:
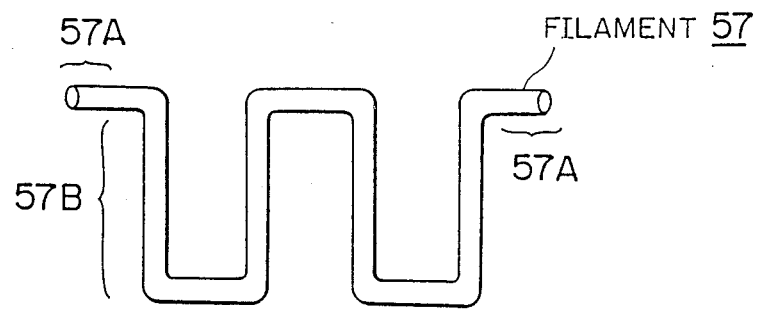
FIG. 8 is a side view of the filament shown in FIG. 6.
Figure 9:
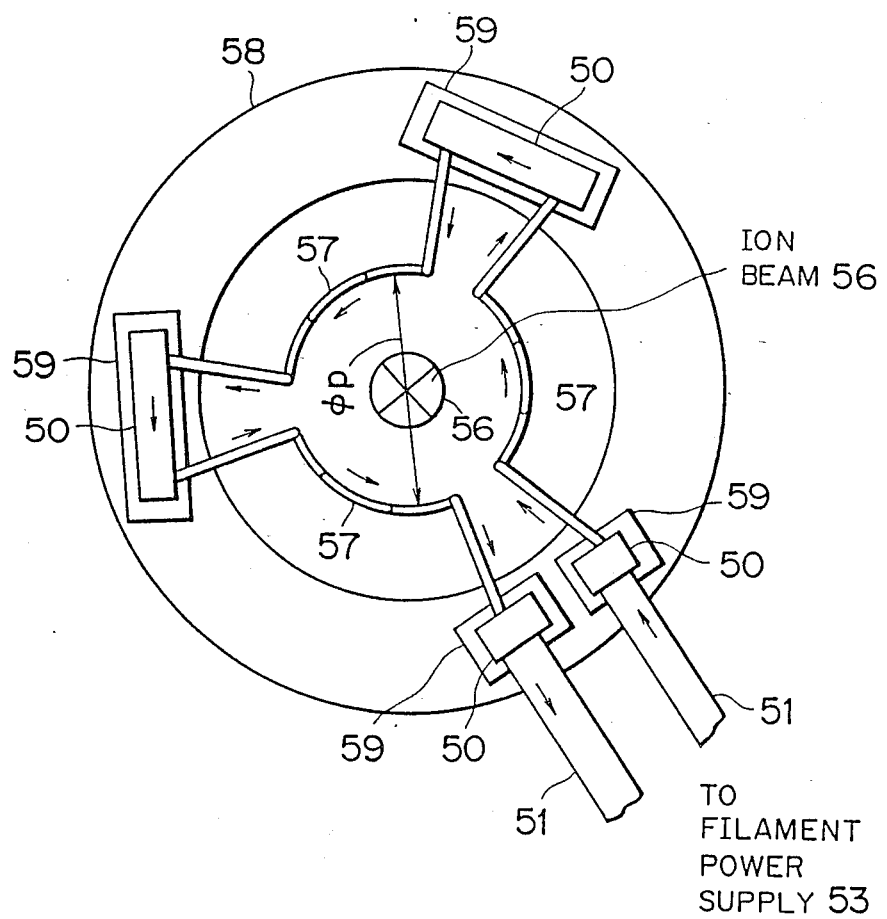
FIG. 9 schematically illustrates the filament connection of the ion neutralizer shown in FIG. 6.

Following are illustrated in FIG. 6 to FIG. 9: 57 shows a separated filament, for example a W-shaped filament (see FIG. 8); 58 shows a ring-shaped insulator board; 59 shows a filament supporting block supporting the end portion 57A of a separated filament made of a conductive material; 50 shows a filament holder for fixing the filament 57 in a small groove on the supporting block 59; 51 shows a filament lead wire connected to the filament heating power supply 53 and a filament current is supplied through this lead. FIG. 7 shows a plan view of the filament 57; FIG. 8 shows a side view of the filament; FIG. 9 shows a plan view of a schematic filament diagram showing how the filament 57 is electrically connected.

Following are the explanations on the ion neutralization operation of this ion neutralizer. As shown in FIG. 6, the separated filament 57 emits thermoelectrons heated by alternating current (AC) power supply 53, and the ion beam 56 is neutralized while passing through these thermoelectrons. The end part 57A of the filament 57 is supported by the conductive filament supporting block 59 placed on the insulator board 58 (filament supporting block), and the filament holder 50 is applied upon it for fixing it. The flow direction of the filament current of the filament 57 is shown with arrow marks in FIG. 9.

FIG. 7 and FIG. 8 show a plan view and a side view of the filament 57 respectively. The end part 57A is fixed on the filament supporting block 59 as shown in the above drawings. The small elongation of the filament by heat is absorbed in the W-shaped bent part 57B of the filament 57 (see FIG. 8). Due to the featured heater construction, a change in the filament diameter ($d\phi$ in FIG. 9) as an important factor for the control of neutralization does not occur.

MODIFICATIONS OF SEPARATED FILAMENT ASSEMBLY

Figure 10:
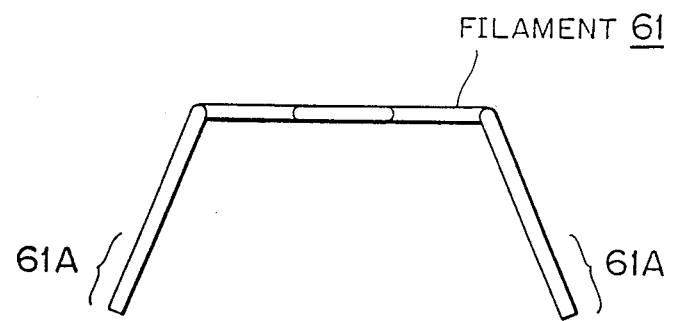
FIGS. 10 to 12 schematically show a separated filament assembly modified from the filament assembly shown in FIG. 6.
Figure 11:
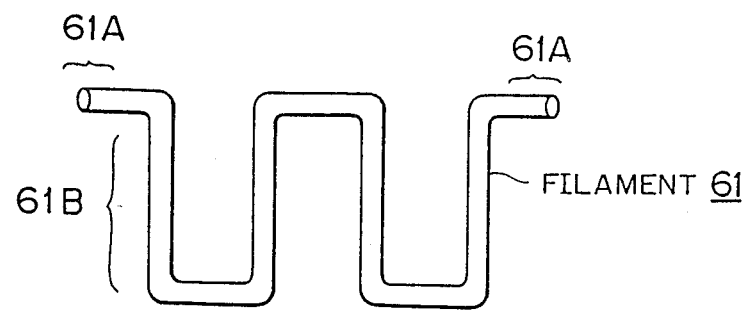
Figure 12:
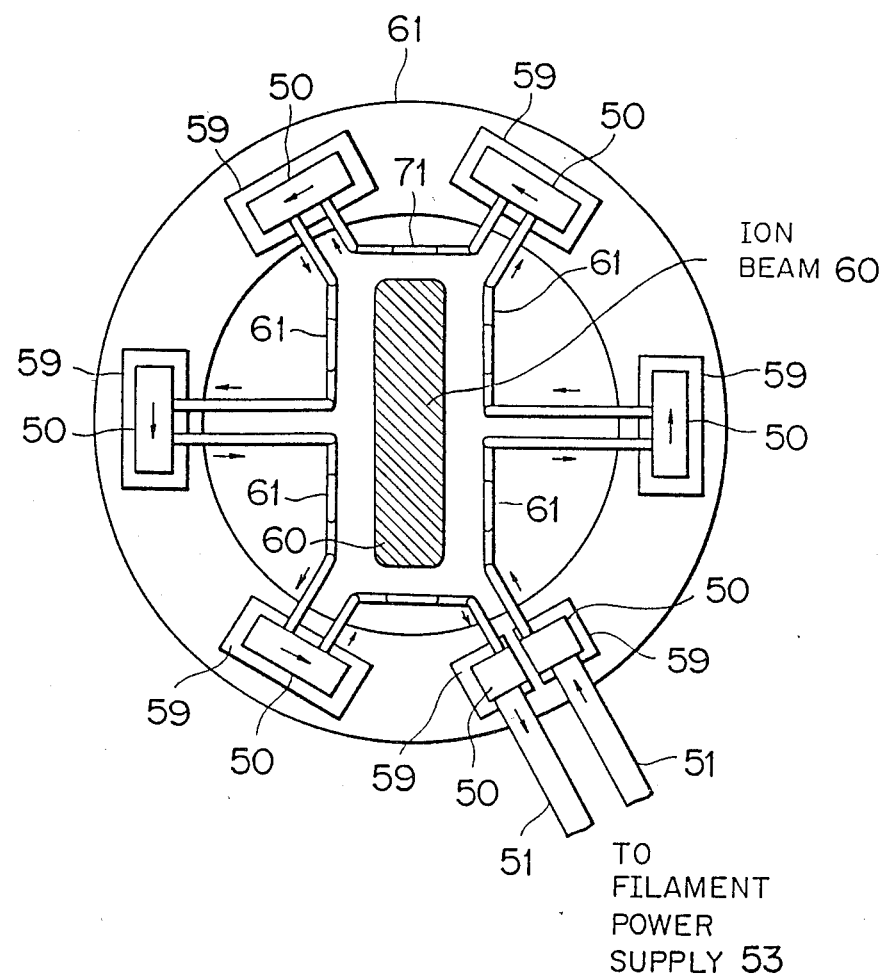

As shown in FIG. 10 to FIG. 12, the filament 61 is divided into the plural number of pieces (i.e., filament elements) according to the shape of the ion beam 60, for example the shape of a longish form in cross-section, and the end part 61A of the filament 61 may be supported by the filament supporting block 59 placed on the insulator board 58 and fixed by the filament holder 50 as shown in FIG. 6 (see FIG. 9). The quantity of thermoelectrons to be used for neutralization in the ion beam 60 can be increased or decreased by changing the length of the W-shaped bent part 61B of the filament 61. Accordingly, neutralization of the ion beam 60 can be performed uniformly.

In the above embodiment, a current supply source for the filaments (filament power supply 53) is of one unit type but each separated filament element can be supplied by each independent power supply.

In the above embodiment, electrical connections of filaments (57 and 61) are made on the filament supporting block 59, but a supporting means and electrical connecting means of the filaments can be independently selected.

In the above embodiment, the alternating current (AC) power supply 53 is used for heating the filaments (57 and 61) but a direct current (DC) power supply can also be used.

In the above embodiment, a rod-shaped material is used for forming filaments, but a plate-shaped material can also be used.

In the above embodiment, each separated filament is W-shaped, but other forms of filaments can also be used, so far as they have some bent parts capable of absorbing such an elongation by heat.

The ion neutralizer including the separated filament assembly according to the preferred embodiment will now be summarized.

That is, the ion beam neutralizing apparatus is characterized in that the entire filament for emitting thermoelectrons is divided into the plural number of filament assemblies (elements).

In the ion beam neutralizing apparatus according to the preferred embodiment, thermal deformation of the filament is suppressed by division of the filament. Since the produced deformation is absorbed in the divided filament elements, the neutralization of an ion beam can be readily controlled.

OPPOSITE THERMOELECTRONS EMITTING SOURCES

Next, as to the ion neutralizer 70 according to a second preferred embodiment, a detailed description is made referring to FIG. 13.

Figure 13A:
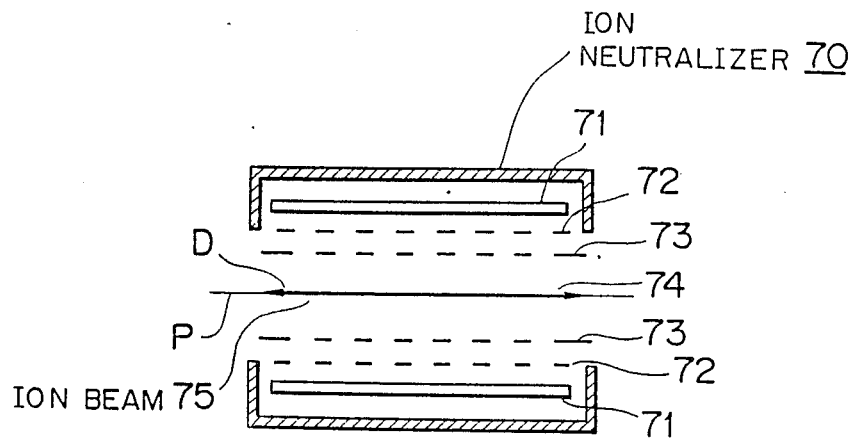
FIGS. 13 and 14 are sectional views of an ion neutralizer according to a second preferred embodiment of the invention.
Figure 13B:
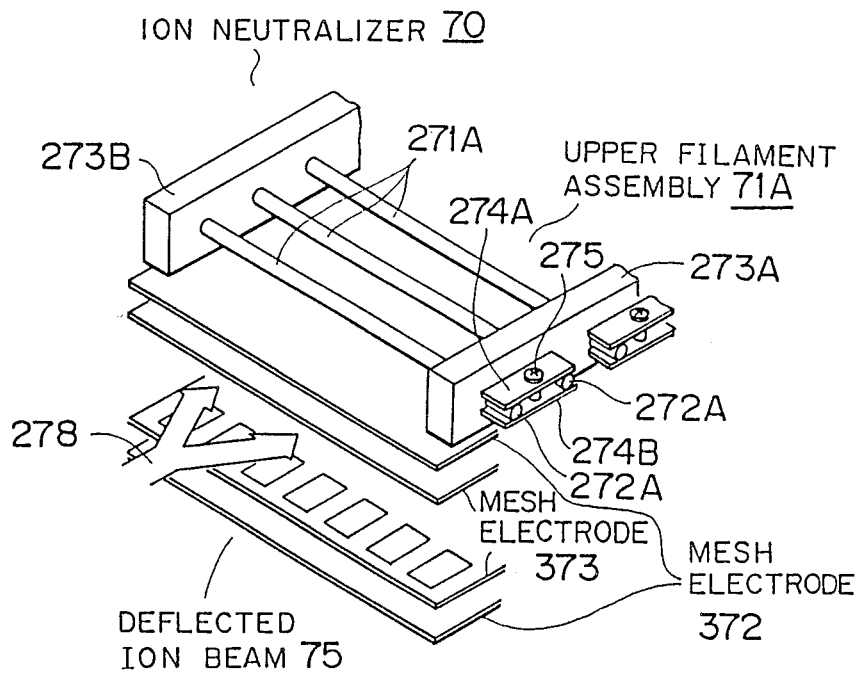

FIG. 13A shows a cross sectional view of the ion neutralizer 70. FIG. 13B is an illustration for explaining the ion neutralization by the neutralizer 70. The schematic construction of the ion neutralizer 70 is shown below.

Figure 5:
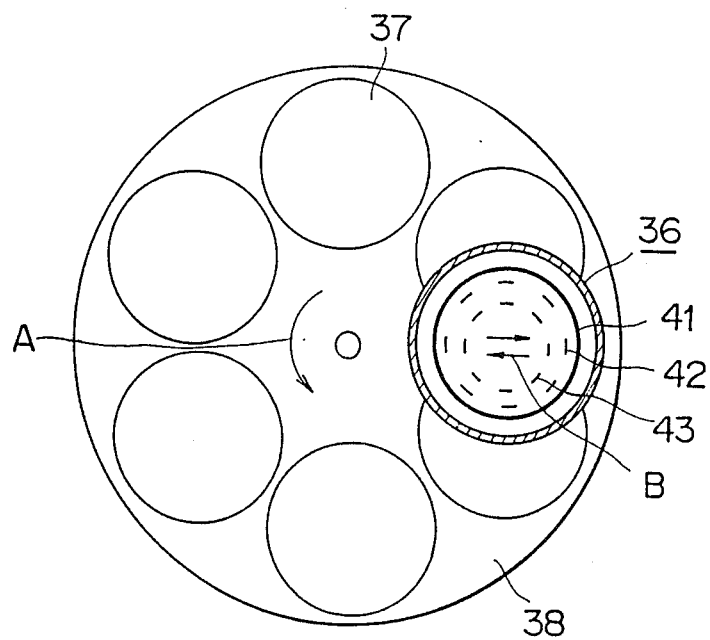
FIG. 5 is a cross-sectional view of the ion neutralizer employed in the irradiating apparatus shown in FIG. 4.
Figure 4:
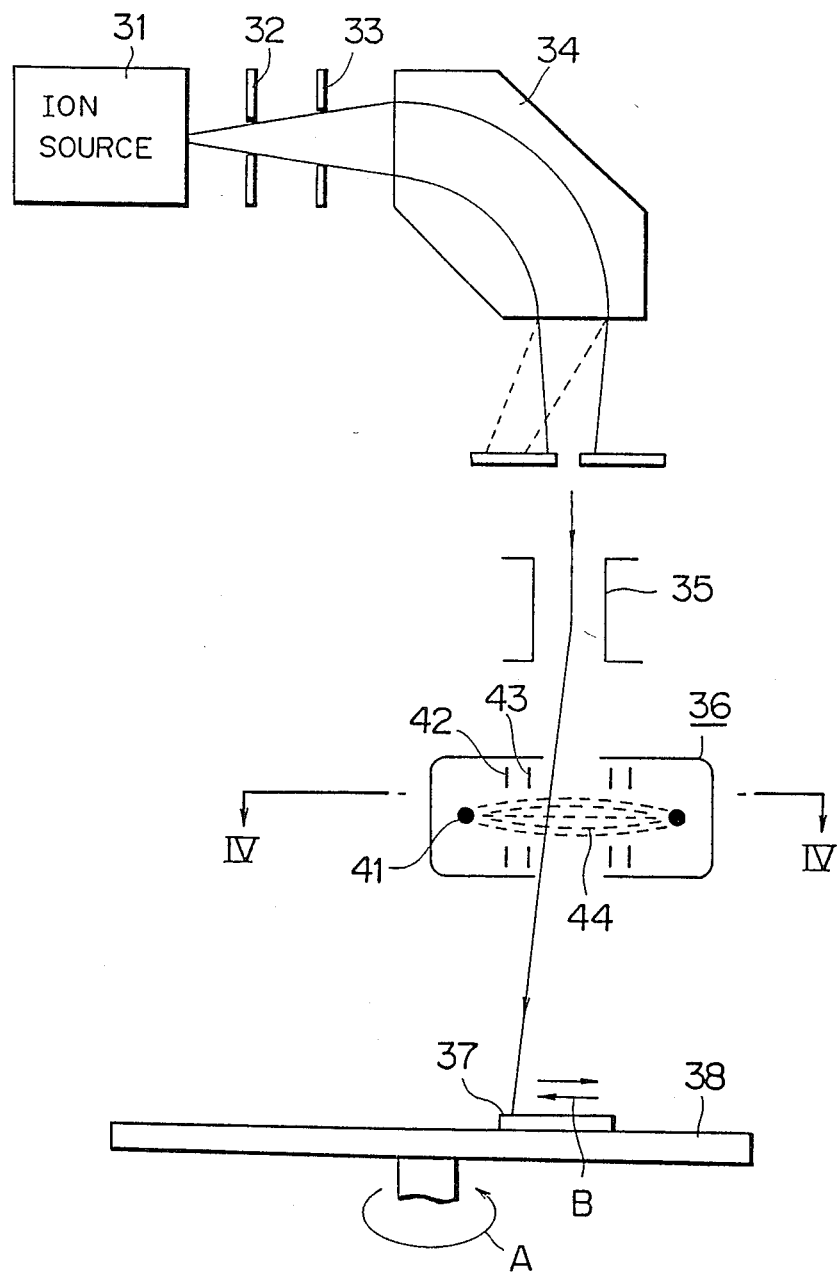
FIG. 4 is a schematic diagram of another conventional ion beam irradiating apparatus.

The filament 71, for example a wire-shaped substance, is stretched being opposed to a plane "P". The plane P is constituted by the orbit of the displacement caused by deflection of the ion beam when the direction of the displacement is in the direction of an arrow mark "D". The filament 71 sandwiches the orbit of the ion beam 75, accordingly. The electrodes 72 and 73 are also arranged to be opposed to the plane P. Reference numeral 74 is an emitted thermoelectron current called an electron shower. Reference numeral 75 shows an ion beam. Next, the explanations are given on the operation. The electron shower 74 is generated in the conventional way, but the shower shape is formed according to the shapes of electrodes 73 and 74, so that its shape becomes long and narrow. In the neutralizer 70 having the construction as described in the second preferred embodiment, even though the ion beam is deflected in the direction of the arrow mark D, the neutralizer 70 is opened in this direction, so that the electrodes 72, 73 and the filament 71 do not disturb the passage of ion beam 75. Therefore, even if the deflection angle is made large, the ion beam does not collide against the electrode 43 as in the case of the conventional neutralizer 36 shown in FIG. 4 and FIG. 5. Since the deflection of the ion beam 75 is performed at a high speed, it can be considered that the long and narrow-shaped ion beam 75 of low density can pass constantly through the opposite plane P.

Thus, the quantity of thermoelectrons necessary for neutralization is almost the same as the conventional neutralization apparatus. The distance between the filament 71 and the electrodes 72 and 73 is also almost the same as the conventional one, therefore the control voltage etc. are also almost the same.

Referring now to the illustration of the ion neutralizer 70 in FIG. 13B, a detailed construction thereof will be described. For the sake of simplicity, the lower filament assembly 71B is omitted and therefore, the following explanation is given to the upper filament assembly 71A only. This upper filament assembly 71A is constructed of a plurality of tungsten filament elements 271A each having a circular section. As is shown in FIG. 13B, a plurality of tungsten circular filament elements 271A are arranged in parallel with each other in such a manner that both end portions 272A, 272B thereof penetrate through insulating heater supporters 273A, 273B. The adjoining end portions 272A projected from the corresponding filament supporter 273A are electrically connected by employing conductive plates 274A, 274B together with a screw 275. As a result, each of the filament elements 271A is series-connected to each other to finally form a single (upper) filament assembly 71A. These upper and lower filament assemblies 71A and 71B are positioned to sandwich the orbit of the ion beam 75 which can be deflected in a wide deflection range, i.e., an entire width of the filament assembly 71A or 71B. Between the upper and lower filament assemblies 71A, 71B (not shown in detail), there are provided two pairs of mesh electrodes 372 and 373 elongated along the upper and lower filament assemblies 71A and 71B. In accordance with the preferred embodiment, the ion beam 75 can be deflected in a large deflection angle as illustrated by an arrow 278, as compared with the conventional deflection angle.

Figure 14:
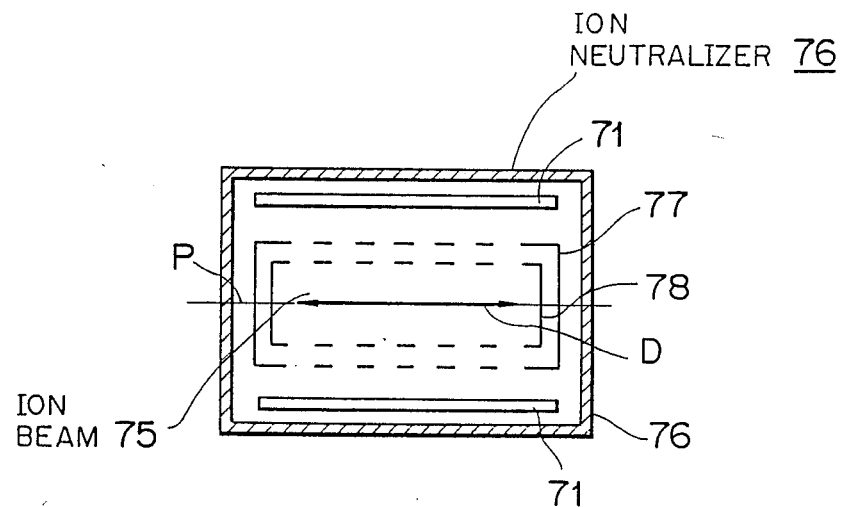

In the above-described preferred embodiment shown in FIG. 13, explanations are given on the electrodes 72 and 73 controlling thermoelectrons arranged being opened in the deflecting direction of the ion beam 75 (the arrow mark D), but in the construction, for example having electrodes 77 and 78 arranged to surround the ion beam 75 completely as shown in FIG. 14, the same effectiveness for neutralization can also be obtained as in the case of the above embodiment. In this case, the lengths of electrodes 77 and 78 in the direction of the arrow mark D are required to be longer than the length of displacement by deflection of the ion beam 75. In this embodiment, in addition to the effect in the second preferred embodiment shown in FIG. 13, following advantage can be obtained. Emitted thermoelectrons can be prevented from getting away in the deflecting direction, and so the efficiency of thermoelectrons colliding against the ion beam 75 can be increased.

As for the shape of the filament 71, the previous explanation is given on an example using a usual wire-shaped filament element, but of course the material for the filament is not limited to the above one and other materials such as a ribbon-shaped or a rectangular tantalum plate can also be used for the filament material. When the comparison is made between a rectangular filament and a wire-shaped filament having the same cross sectional area, the rectangular filament has a feature of emitting larger quantity of thermoelectrons at the same temperature.

As for materials for the filament 71, besides metals of high melting point such as tungsten or tantalum, borides of rare-earth elements (for example $LaB_6$ [lanthanum boride], $YB_6$ [yttrium boride], $CeB_6$ [cerium boride], etc.) or oxides of rare-earth elements (for example $BaWO_4$ [barium tungstate], $Y_2O_3$ [yttrium oxide], $ThO_2$ [thorium oxide], etc.) can be used with similar effectiveness. These borides or oxides of rare-earth elements have high thermoelectron emitting capacity at a low temperature in comparison with that of metals. When these materials are used, for example, to obtain the capacity of emitting thermoelectrons of 15 $A/cm^2$, the required temperature for tungsten is 3,000° K while that for $LaB_6$ 2,500° K is good enough, so that electric power consumption for heating the filament of the high emission capacity can be decreased.

The manufacturing in production level of these materials of rare-earth elements is possible by employing press sintering.

In above second preferred embodiments, explanations are given on apparatuses providing two pairs of electrodes 72 and 73, and 77 and 78 as thermoelectron control means to control supply quantity and energy quantity of thermoelectrons, but in the case of an apparatus having a single electrode to control the supply quantity of thermoelectrons, the same effect as in the case of the above embodiments can be obtained. Grating type electrodes are used for electrodes 72 and 73, and 77 and 78, but any type of electron passing electrode is good for usage.

The features of an ion beam irradiating apparatus in this embodiment will now be summarized.

The ion beam irradiating apparatus includes a thermoelectron emitter for supplying thermoelectrons to an ion beam on its ion beam trajectory, and a thermoelectron control means to control the supply quantity of thermoelectrons, and the ion beam trajectory is located between the thermoelectron emitter and the thermoelectron control means. Both emitter and control means are positioned opposite to the plane formed by the locus of displacement caused by deflection of the ion beam.

The thermoelectron emitter and the thermoelectron control means in this ion beam irradiating apparatus are so constituted as to be opposed to the plane formed by the locus of displacement by deflection of the ion beam. The features of the apparatus are shown below. In the direction of displacement by deflection of the ion beam, the distance from the beam trajectory can be made long and so even if the deflection angle is made large the ion beam does not collide with the thermoelectron control means.

As mentioned above, in this embodiment, there is a particular advantage of obtaining an ion beam irradiating apparatus.

That is, even if the deflection angle of the ion beam is made large, heavy metal pollution of a sample or damage of an electrode is prevented, and for a large diameter sample there is no need of making the apparatus large, by such a construction of the apparatus as providing an ion emitter to supply thermoelectrons to an ion beam on its ion beam trajectory, and a thermoelectron control means to control supply quantity of above mentioned thermoelectrons, and the ion beam trajectory is put between the thermoelectron emitter and the thermoelectron control means, and they are located opposite to the plane formed by the locus of displacement caused by deflection of the ion beam.

ELECTRON SHIELD ELECTRODE OF ION NEUTRALIZER

Figure 1:
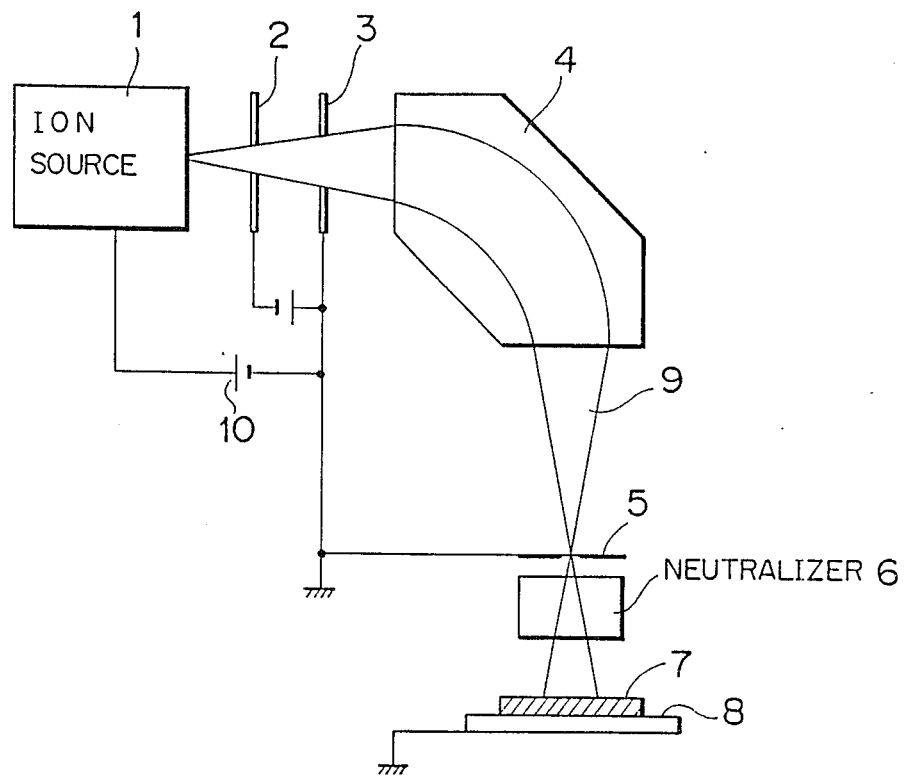
FIG. 1 is a schematic diagram of one conventional ion beam irradiating apparatus.
Figure 2:
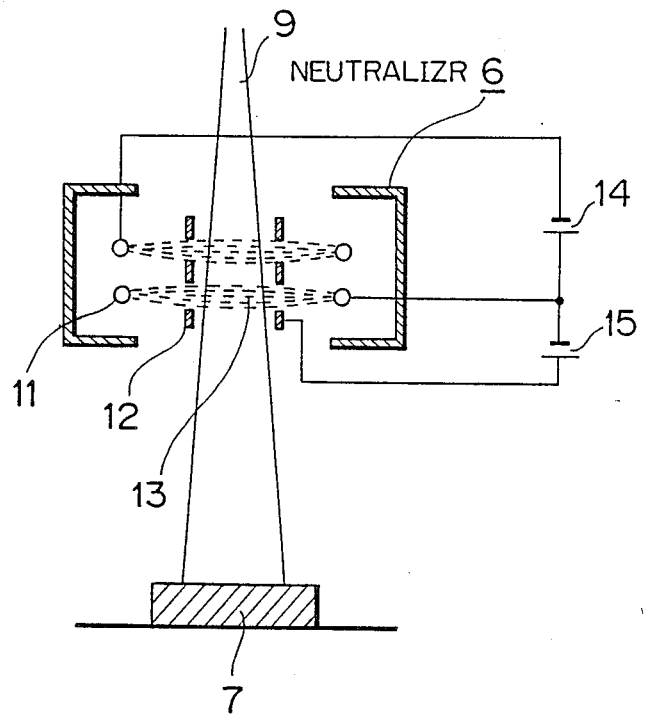
FIG. 2 is a schematic diagram of the ion neutralizer employed in the conventional ion beam irradiating apparatus shown in FIG. 1.
Figure 3:
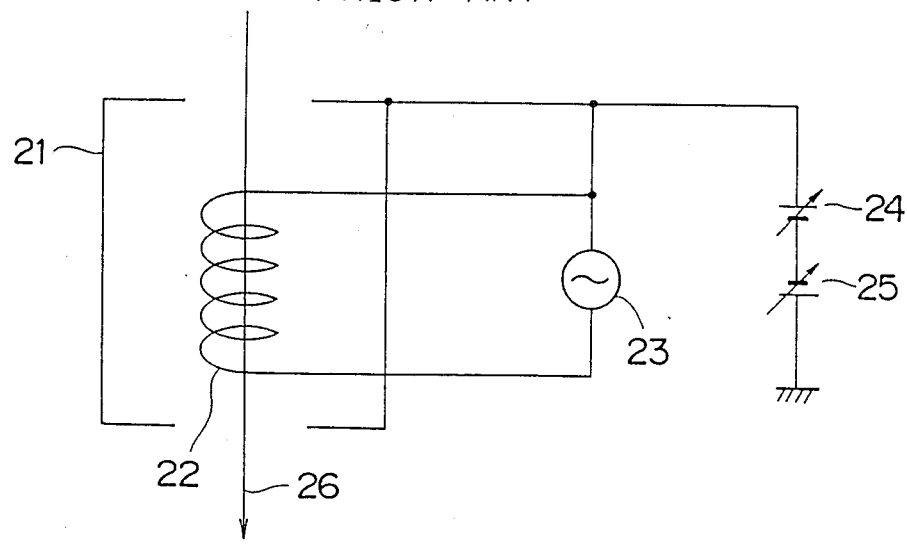
FIG. 3 is a schematic diagram of another conventional ion neutralizer.

For example, in the conventional ion neutralizer 6 shown in FIG. 2, the thermoelectron emitter (filament) 11 is arranged very close to the ion beam; because of this, drawing-in to the ion beam 9 by thermoelectrons and neutralization of the beam are effectively performed. There are, however, various problems found in this kind of neutralizer as shown in the following.

The heat generated from the filament 11 is thermally shielded by the electron shield electrode (a thermoelectron control means) 12 but the heat radiation from the filament 11 is absorbed by a vacuum chamber (not shown in a drawing), incorporating the neutralizer 6, through the electron shield electrode 12. Therefore, much filament power is needed to heat up the filament to a predetermined temperature, e.g. 2,000° to 2,500° C. This is one of the problems in the conventional neutralizer.

A third preferred embodiment is accordingly invented to solve the problem as mentioned above, and to obtain an ion beam neutralizer designed to make it possible to decrease filament power consumption.

The ion beam neutralizer related to the third embodiment is disposed on the outer peripheral side of the filament and is characterized by the provision of electron shield electrodes constructed of a first shield, and a second shield disposed on the outer peripheral side of the first shield.

Figure 15:
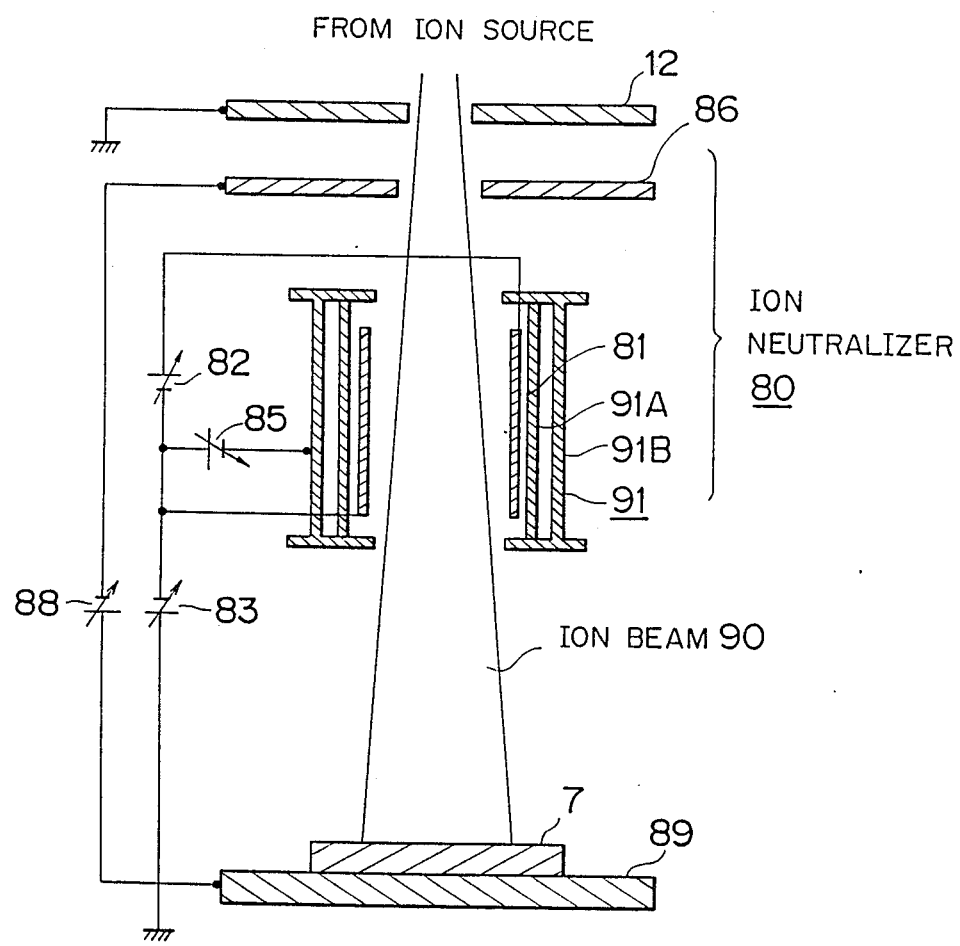
FIG. 15 schematically shows an ion neutralizer according to a third preferred embodiment of the invention.
Figure 16:
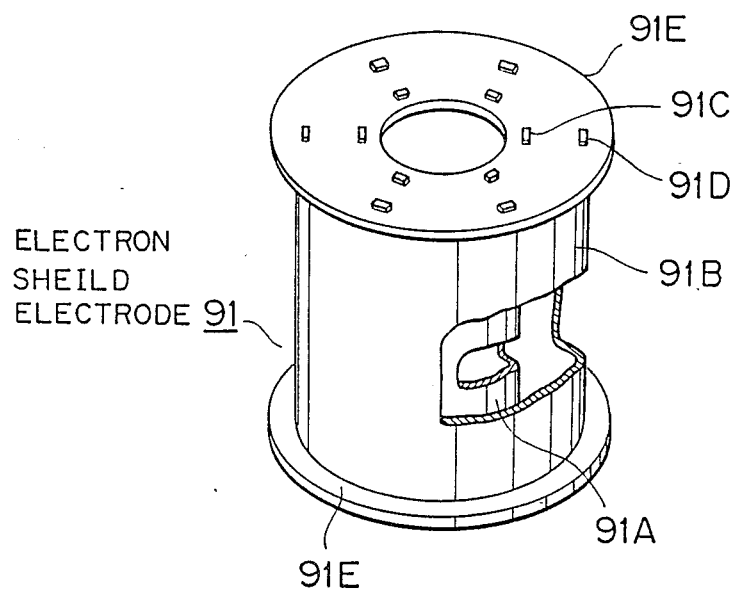
FIG. 16 is a perspective view of the ion neutralizer shown in FIG. 15.
Figure 17:
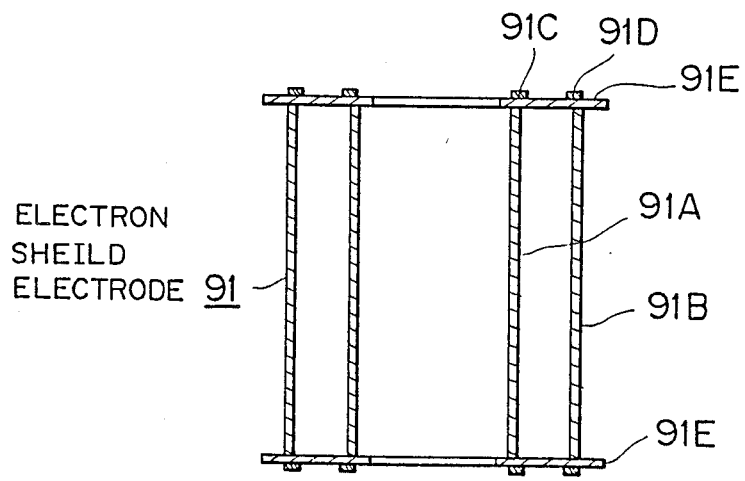
FIG. 17 is a cross-sectional view of the ion neutralizer shown in FIG. 15.

FIG. 15 shows a schematic diagram illustrating the inner structure of an ion neutralizer 80 according to the third preferred embodiment. In FIG. 15, reference numeral 81 is a filament to emit electrons; 82 is a power supply for heating the filament 81; 83 is a power supply for applying a potential to the filament 81; 86 is a shield electrode for preventing diffusion of thermoelectrons to prevent thermoelectrons from diffusing into the direction opposite to the direction of thermoelectrons directed toward a specimen or sample 7 in the trajectory of an ion beam 90, and it is given a negative potential by the fourth power supply 88; 89 is a specimen table; 90 is an ion beam; 80 is a neutralizer to neutralize the ion charge on the surface of the specimen 7. Reference numeral 91 is an electron shield electrode consisting of the first shield 91A, and the second shield 91B arranged on the outer peripheral side of the first shield 91A, and it works also as a thermal shield for filament 81 and is given a negative potential by the third power supply. The aperture 92 for the neutralizer 80 is arranged on the shield electrode for preventing diffusion of thermoelectrons. FIG. 16 and FIG. 17 show a perspective side view and a longitudinal cross-sectional view of the electron shield 91. In this embodiment, the first shield 91A and the second shield 91B are formed in cylindrical forms with the use of molybdenum plate having excellent heat resistance. On both ends of each of them, tabs 91C and 91D are provided and a torus-shaped, thin, circular plate 91E is fixed on the end parts. The tabs 91C and 91D of the first shield 91A and the second shield 91B are fitted into the plural number of holes provided on this circular plate and bent to construct an electron shield electrode 91 of integrated structure.

Next, explanations are given on the thermal shielding operation of this invention. In FIG. 15, the filament 81 emits thermoelectrons into the direction of the ion beam 90 heated by the first power supply 82, and the ion beam 90 is neutralized in passing through the flow of these thermoelectrons. At this time, the electron shield electrode 91 consisting of the first shield 91A and the second shield 91B has an effective thermal shielding function for the filament 81, and heat radiation through this electron shield electrode can be decreased. Due to this effect, the filament 81 is effectively heated, that is a prescribed filament temperature can be reached with a comparatively small amount of filament power, accordingly the influence of the filament heat affecting its surroundings is decreased. It contributes to the work of obtaining a long-life neutralizing apparatus.

In the above embodiment, a molybdenum plate is used for the first shield 91A and the second shield 91B of the electron shield electrode 91, but any other material having good heat resistance, for example graphite or tantalum, can be used.

In the above embodiment, explanations are given on the case of a double structure of the electron shield electrode 91 consisting of the first shield 91A and the second shield 91B, but it may have a triple structure or multiple structure. An opening port can be arranged on the electron shield electrode to be used for a drawing out port of filament leads. The electron shield electrode may be a split arc type or a square type electrode. The first power supply 82 for heating the filament can be an alternating current (AC) power supply.

Figure 18:
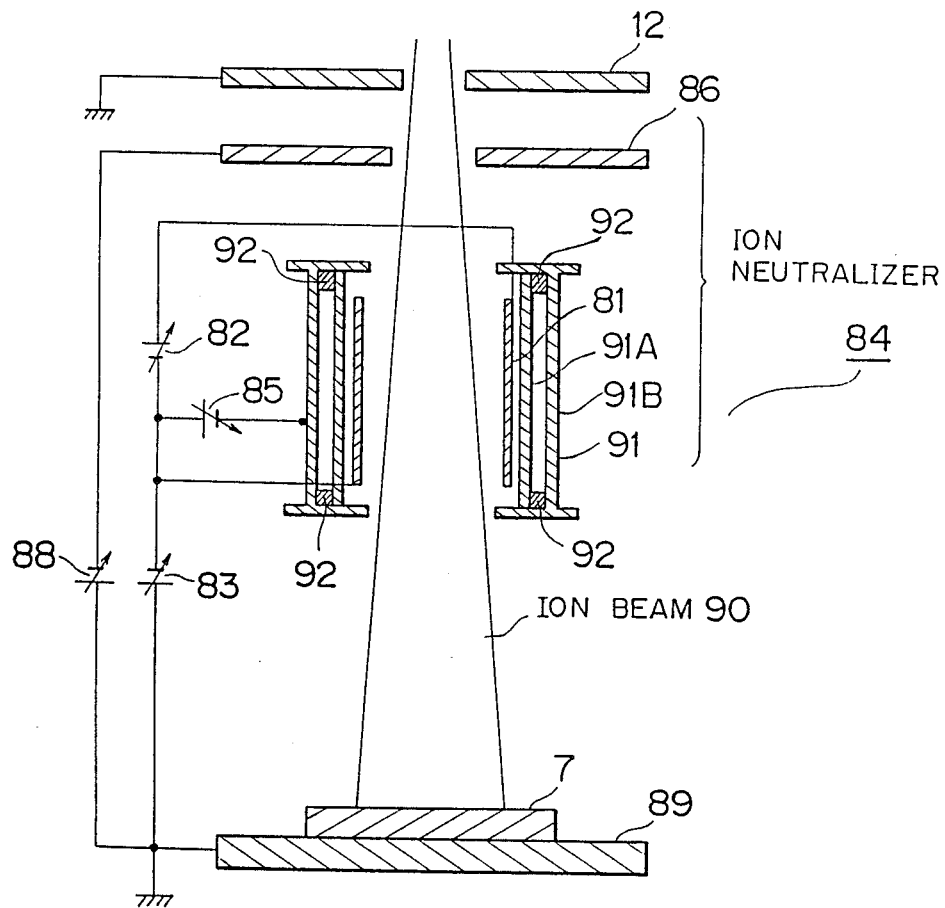
Figure 19:
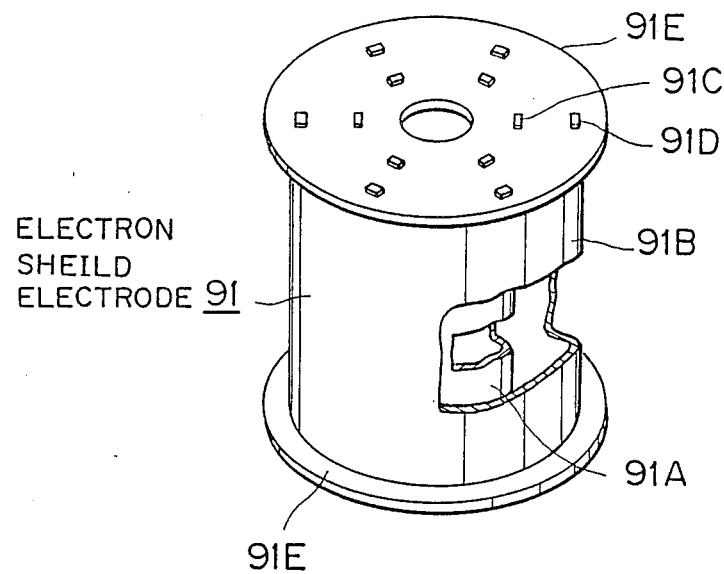
Figure 20:
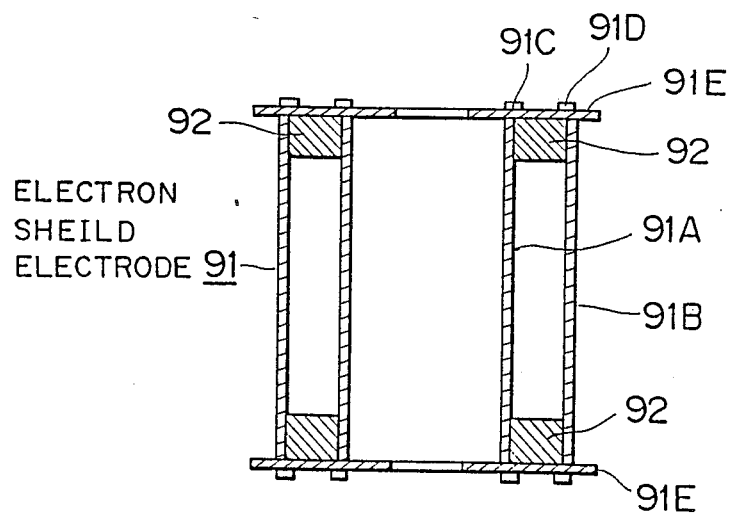

In the following, explanations are given on the modified embodiment of the electron shield electrode according to the third preferred embodiment, referring to FIG. 18 to FIG. 20.

The same numerals are given to the same or similar components to those of constituent components of the ion neutralizer 80 shown in FIG. 15 to FIG. 17, and the explanations thereof are omitted In the case of the ion neutralizer 84 shown in FIG. 15 to FIG. 17, a heat resistive guide 92, for example, a guide made of ceramics, is disposed between the end parts of the first shield 91A and the second shield 91B of the electron shield electrode 91. The electron shield electrode 81 is supported and reinforced by the heat resistive guide 92, and its thermal deformation is prevented.

Figure 21:
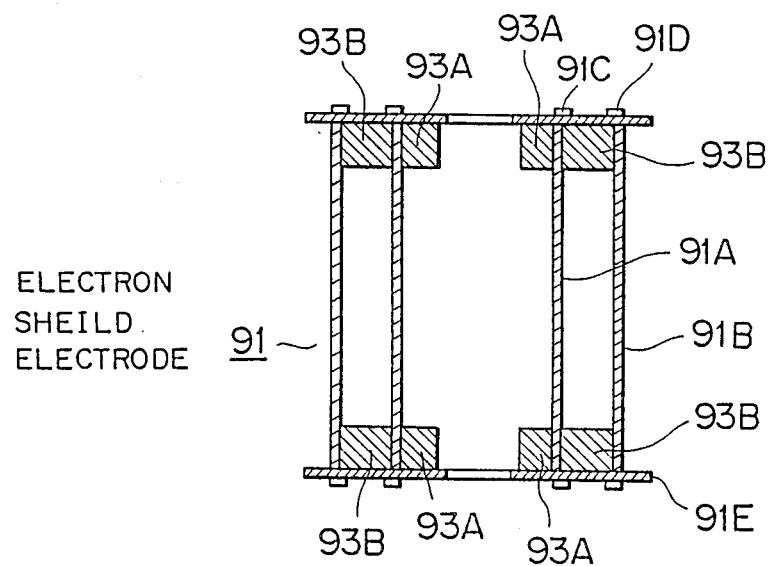
FIGS. 18 to 21 schematically show another ion neutralizer according to the third preferred embodiment.

Furthermore, according to this embodiment, as shown in FIG. 21, a heat resistive guide 93A may be disposed on the inner peripheral side of the first shield 91A, or another heat resistive guide 93B may be disposed on the outer peripheral side of the second shield 91B, or these guides may be disposed in a preferable combination FIG. 21 shows an embodiment including both of these heat resistive guides 93A and 93B. Owing to this construction, reinforcing force is much upgraded.

In the above embodiment, explanations are given on the case employing ceramics, but if the material is good in heat resistance, for example molybdenum, tantalum, tungsten, etc., any of these materials may be used to make heat resistive guides.

Following are the summarization of aforementioned detailed explanations on the ion neutralizer according to the third preferred embodiment.

In an ion beam neutralizer, neutralizing an ion beam by thermoelectrons emitted from a filament being heated, this is an ion beam neutralizer, characterized in that there is provided an electron shield electrode arranged on the outer peripheral side of the filament, and consisting of the first shield and the second shield disposed on the outer peripheral side of the first shield.

In an ion beam neutralizer, neutralizing an ion beam by thermoelectrons emitted from a filament being heated, this is an ion beam neutralizer, characterized in that there are provided an electron shield electrode arranged on the outer peripheral side of the filament, and consisting of the first shield and the second shield disposed on the outer peripheral side of the first shield, and heat resistive guides supporting this electron shield electrode.

As described above, according to the third preferred embodiment, the thermal efficiency of the filament is improved and the electric power to be supplied to the filament can be decreased by provision of an electron shield electrode arranged on the outer peripheral side of the filament, and consisting of the first shield and the second shield disposed on the outer peripheral side of the first shield. The thermal deformation of the electron shield electrode can be prevented by heat resistive guides.

THERMAL RADIATION SHIELDING PLATE

Referring back to FIG. 2, in the conventional ion neutralizer 6, the space between the filament 11 and the specimen 7 is opened, so that there are problems as shown in the following: the temperature of the specimen or sample 7 is raised by the radiation heat from the filament 11 and the resist applied to the specimen 7 is exposed to light rays; a heavy metal (for example tungsten) consisting of the filament 11 is evaporated because of a high temperature and the evaporated material is dispersed and the specimen 7 is polluted.

Furthermore, much heat energy is dissipated by radiation from the filament 11, so that much electric power is necessarily needed for heating the filament 11. This is another problem.

An ion beam irradiating apparatus according to the fourth preferred embodiment has been invented to solve problems as described above. It is characterized by the following: the temperature rise of a specimen can be decreased; the pollution of the specimen by a heavy metal can be prevented; power consumption can be decreased.

The ion beam irradiating apparatus according to the fourth preferred embodiment is equipped with a thermoelectron emitter to supply thermoelectrons to an ion beam on its trajectory, a thermoelectron control means to control supply quantity of thermoelectrons, and a shielding means to shield a specimen from being irradiated by radiation heat radiated from a thermoelectron generator.

The shielding means in this embodiment shields the specimen from being irradiated by the radiation heat radiated from the thermoelectron emitter and further it has the function of shielding the specimen from being reached by a vaporized heavy metal, and it prevents the radiation heat of the thermoelectron emitter to be dispersed and decreases electric power consumption.

Figure 22:
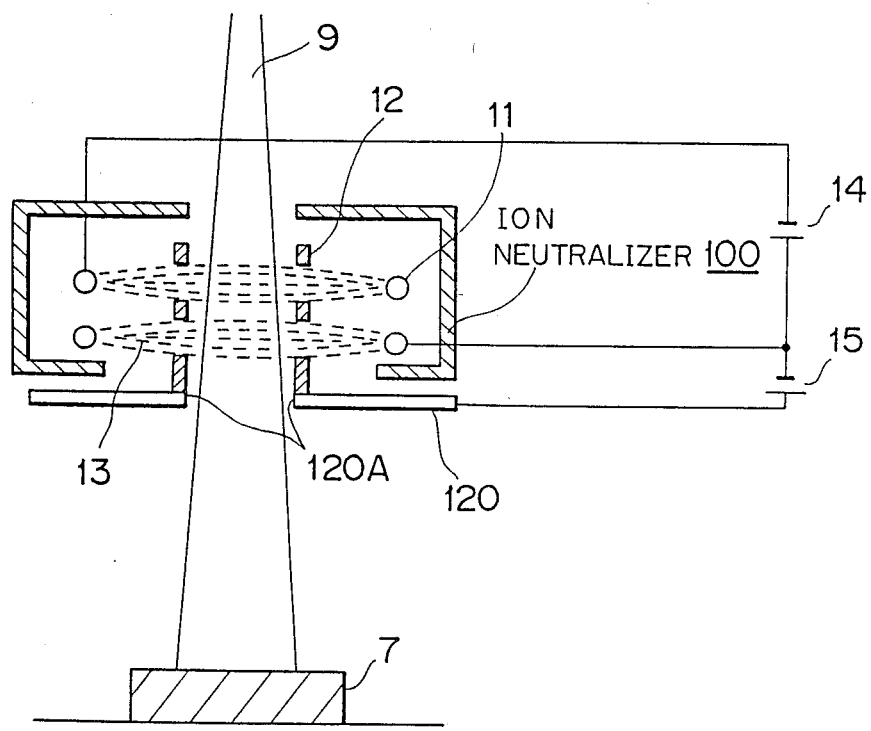
FIG. 22 schematically shows an ion beam neutralizer employing a radiation shielding plate according to a fourth preferred embodiment of the invention.

FIG. 22 shows cross-sectional constructional view showing an ion beam neutralizer 100 related to an ion beam irradiating apparatus in the fourth preferred embodiment of this invention. Reference numeral 120 denotes a shielding means to shield the specimen 7 from being irradiated by radiation heat radiated from the filament 11, the thermoelectron emitter. For example, it is a shielding plate provided in connection with a thermoelectron drawing electrode 12, a control means of thermoelectrons, through a connecting portion 120A.

This shielding plate 120 extends so as to isolate the specimen 7 from the filament 11, for example it is arranged on the whole periphery to encircle the trajectory of the ion beam 9, and is biased to be the same potential as that of the electrode 12. In operation, the temperature of the filament 11 rises to 2,000 to 2,500° C. as in the conventional neutralizer 6, but the specimen 7 can be protected by the shielding plate 120 from being directly irradiated by the radiation heat from the filament 11. On the other hand, the surface of the shielding plate 120 facing the filament is directly exposed to the filament 11, and so its temperature is increased. In other words, the shielding plate 120 itself gives heat radiation to the specimen 7. The temperature of the shielding plate can be controlled to be about 1,000° C. when it is formed by a metal having a high melting point and a high reflection factor such as tantalum.

It is a well known fact that the energy of heat radiation increases or decreases in proportion to the fourth power of the absolute temperature of a substance. Therefore, as in this embodiment, the energy of heat radiation received by the specimen from the shielding plate is much decreased in comparison with the energy directly received from the filament 11. Accordingly, the temperature rise of the specimen can be much decreased. Vaporized heavy metal, constituent material of the filament 11, is blocked by the shielding plate 120 and it cannot reach the specimen. THe quantity of the heavy metal vaporized from the shielding plate 120 is of a negligible order because of its low temperature.

In the embodiment described above, the shielding plate 120 is described as a single plate, but of course it can be double or triple structure for the trajectory of the ion beam 6, and shielding effect will be increased in that case. In the multiple structure, the potential of each plate can be the same or different.

Figure 23:
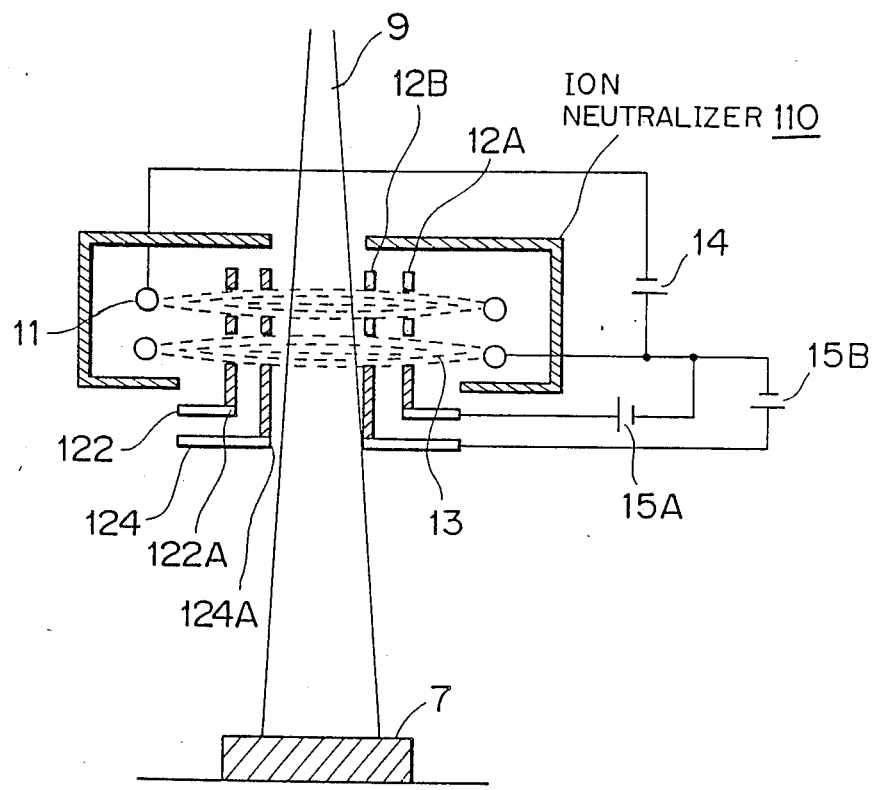
FIG. 23 schematically illustrates a modified ion beam neutralizer according to the fourth preferred embodiment of the invention.

FIG. 23 shows a cross-sectional, constitutional view showing a neutralizer 110 related to an ion beam irradiating apparatus according to another embodiment. In FIG. 23, an electrode 12A is provided as a first control means to control the quantity of thermoelectrons to be supplied to the ion beam 9 and it is energized by a power supply 15A; an electrode 12B is provided as a second control means to control the quantity of energy to be supplied to thermoelectrons and it is energized by a power supply 15B. The first and the second shielding plates are connected respectively with these electrodes 12A and 12B through connecting parts 122A and 124A. This arrangement takes the same advantages as those of the above mentioned embodiment. The neutralizer 110 in this example has an arrangement enabling to independently control two parameters, supply quantity and energy quantity of thermoelectrons. In this case, the first and the second shielding plates 122 and 124 may be provided on either electrode 12A or 12B.

As aforementioned, according to the fourth embodiment, in an ion beam irradiating apparatus irradiating the specimen with an accelerated ion beam, by the provision of a thermoelectron emitter to supply thermoelectrons to an ion beam on the ion beam trajectory, a thermoelectron control means to control supply quantity of thermoelectrons, and a shielding means to shield a specimen from being irradiated by radiation heat radiated from a thermoelectron generator, there is an effect of obtaining an ion beam irradiating apparatus having features as described below: temperature rise of the specimen and pollution of the specimen by a heavy metal are decreased, further heat quantity dispersed from the thermoelectron emitter is decreased, and electric power necessary for heating the thermoelectron emitter is decreased to a lower level than that of the conventional apparatuses.

COOLING DEVICE FOR ION NEUTRALIZER

In some conventional neutralizers a cooling wall or the like is provided close to the filament to emit thermoelectrons. For example, a neutralizer of this type is proposed in Japanese Pat. Publication No. 58-43861. By the provision of such a cooling wall, the temperature of the wall or the temperature of a shielding plate provided near the wall for blocking heat radiation from the filament is set lower than that of the material to be processed by an ion beam.

A conventional ion beam neutralizer has such a structure as described above and the wall arranged close to the filament is kept at a low temperature, so that heat efficiency is lowered and a large electric power has to be inputted to raise the temperature of the filament. From structural reasons, the separation of the filament from the cooling device is very difficult; it makes the maintenance difficult.

The fifth preferred embodiment is invented to solve such problems as mentioned above. It is characterized by the fact of obtaining an ion beam neutralizer having features as described below: an electron emitter of the neutralizer and a wafer can be thermally separated, so that thermal efficiency of a filament can be increased; the main body of the neutralizer including the thermoelectron emitter and a cooling device are structurally separated and maintenance services for the main body of the neutralizer or replacement of it can be done independently from the cooling device.

The ion beam neutralizer according to this fifth preferred embodiment includes the following: an electron emitter to emit electrons; an electron drawing means to draw out electrons emitted from the electron emitter toward the trajectory of the ion beam to irradiate the specimen; an electron energy control means to control the energy of drawn out electrons; a shielding plate to shield the specimen from being irradiated by radiation heat radiated from the electron emitter; a cooling device thermally separating the specimen and the electron emitter fixed on the specimen side of the shielding plate through an insulating member.

Figure 24B:
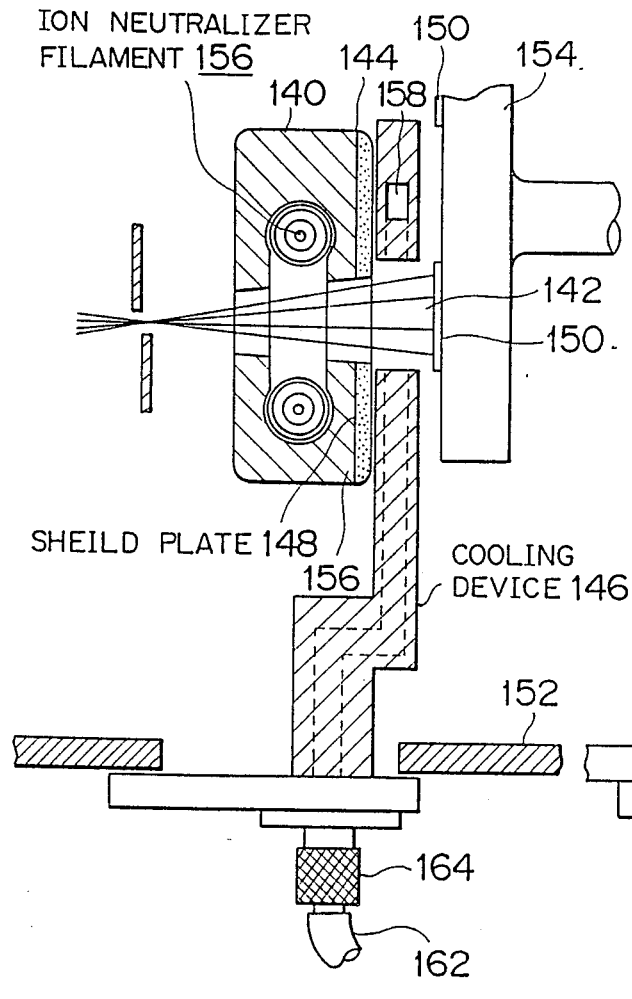
FIGS. 24A, 24B schematically show an ion neutralizer employing a cooling device according to a fifth preferred embodiment of the invention.
Figure 24A:
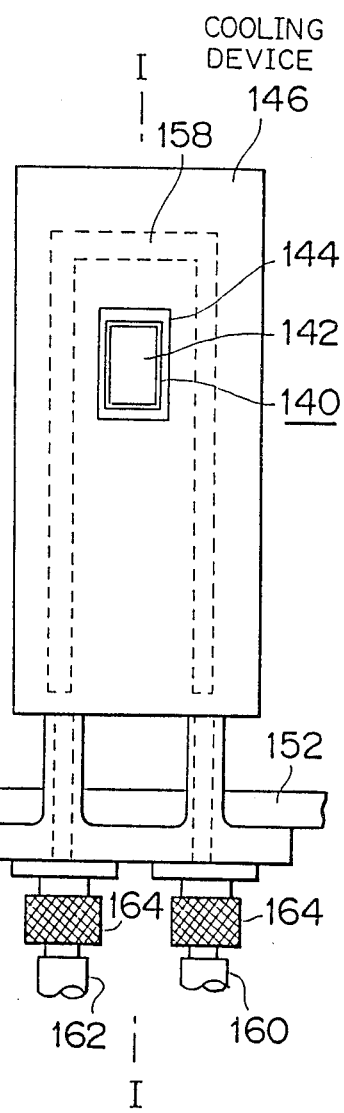

FIG. 24A and FIG. 24B show a front view and a cross-sectional, constitutional view along a line I—I of the ion beam neutralizer in the fifth preferred embodiment of this invention including peripheral equipment. In FIG. 24A and 24B, reference numeral 140 is a main body of a neutralizer neutralizing an ion beam 142 with electrons; reference numeral 144 is an insulator; reference numeral 146 is a cooling device fixed on the wafer 150 side of a shielding plate 148; and reference numeral 152 is a housing of an ion implantation device mounted with the cooling device 146.

The wafer 150 is placed on a wafer supporting body 154. Filaments 156 are provided sandwiching the trajectory of the ion beam 142 between them. A wall 156 encircling the filament 156 is provided, and a cooling pipe 158 used for the cooling device 146 is buried in this wall 156. The cooling pipe 158 is connected to a leading-in (intake) pipe 160 and an exhaust pipe 162. These leading-in pipe 160 and exhaust pipe 162 are connected to the cooling pipe 158 of the cooling device 146 in a detachably connecting method.

Explanations on the thermal shielding operation are given in the following. To prevent a wafer 150 mounted on a semiconductor wafer supporting body from being charged to a positive high potential by implantation of an ion beam, the quantity of electrons emitted into the path of the ion beam 142 is increased or decreased by the control of the current flowing through the filament 156. The explanations on the above-described techniques have been already given. In this case, radiation energy caused by heating of the filament 156 irradiates the shielding plate 148 provided close to the filament and the shielding plate is also heated to a high temperature. The shielding plate 148 blocks the radiation heat radiated by the filament 156. The cooling device 146 is arranged on the wafer 150 side of the shielding plate 148 through an insulator 144, and this can thermally separate the wafer 150 from the filament 156, so that the cooling device 146 and the surface of the wafer 150 arranged close to the cooling device are in a state kept at a low temperature.

The shielding plate 148 arranged close to the heat radiation source 156 works as a thermal shielding against the heat radiation from the heat radiation source 156. Therefore, heating efficiency of the filament 156 emitting thermoelectrons necessary for neutralization is upgraded. Further, the heat energy of the neutralizer 140 is prevented from flowing into the wafer 150 side by the cooling device 146 fixed through the insulator 156, accordingly, the temperature rise of the wafer 150 is prevented.

In above fifth preferred embodiment, as shown in FIG. 24A and FIG. 24B the neutralizer 146 consisting of the filament 156 and the shielding plate 148 arranged close to the filament 156 is shown, but the same particular advantage can be obtained in employing another neutralizer 170 as shown in FIG. 25A and FIG. 25B. In this embodiment a shielding plate 177 is arranged on an electrode 175, and the cooling device 146 is provided on the wafer 150 side of the shielding plate 177 through the insulator 144.

In above embodiment, a wafer is used as a specimen, and explanations are given on a neutralizer to be applied to an ion implantation device for wafers, but another neutralizer to be applied to a processing and deposition device for semiconductors, or to an implantation, processing, or deposition device for insulators holds good for application and the same effect as in the case of the above embodiment can be obtained.

As described above, according to the fifth preferred embodiment, there is a particular advantage of obtaining an ion beam neutralizer having the features as described below: owing to the provision of an electron emitter to generate electrons, an electron drawing means to draw out electrons generated by the electron emitter toward the trajectory of an ion beam irradiating the specimen, an electron energy control means to control the energy of the drawn out electrons, a shielding plate to shield the specimen from being irradiated by the heat radiation from the electron emitter, and a cooling device to thermally separate the specimen and the electron emitter, the neutralizer and the specimen are thermally separated, and heating efficiency of the thermoelectron emitter of the neutralizer is upgraded, and further the main body of the neutralizer and the cooling device are structurally separated enabling easy maintenance and replacement.

What is claimed is:

1. An ion beam irradiating apparatus comprising:
generating means for generating ion beams;
accelerating means for accelerating the ion beams emitted from the generating means;
selecting means for selecting a specified ion beam derived from the accelerated ion beams;
means for holding a sample receiving the specified ion beam derived from the selecting means; and,
ion neutralizer means positioned between the selecting means and the sample holding means, said ion neutralizer means including:
filament means for emitting a thermoelectron beam to neutralize the specified ion beam, said filament means being subdivided into a plurality of W-shaped filament elements having substantially the same length and same diameter and being connected to each other in series and surrounding the specified ion beam.

2. An ion beam irradiating apparatus as claimed in claim 1, further comprising a plurality of filament supporters formed on insulating plates, for supporting end portions of the W-shaped filament elements.

3. An ion beam irradiating apparatus as claimed in claim 1, further comprising alternating current power source means for energizing the filament means.

4. An ion beam irradiating apparatus as claimed in claim 1, further comprising direct current power source means for energizing the filament means.

5. An ion beam irradiating apparatus as claimed in claim 1, wherein said specified ion beam has a substantially circular shape, in a cross section thereof, and said plurality of filament elements surround and are substantially equispaced from said circular-shaped ion beam.

6. An ion beam irradiating apparatus as claimed in claim 4, wherein said specified ion beam has a substantially elliptical shape, in a cross section thereof, and said plurality of filament elements surround and are substantially equispaced from said elliptical-shaped ion beam.

7. An ion beam irradiating apparatus comprising:
generating means for generating ion beams;
accelerating means for accelerating the ion beams generated from the generating means;
selecting means for selecting a specified ion beam from the accelerated ion beams;
means for holding a sample receiving the specified ion beam derived from the selecting means;
ion deflecting means positioned between the selecting means and the sample holding means for deflecting the specified ion beam in a deflection direction perpendicular to an orbit of the specified ion beam; and ion neutralizer means positioned between said ion deflecting means and said sample holding means and including
a thermoelectron beam emitting source sandwiching said orbit of the specified ion beam and being elongated along the deflection direction normal to the specified ion beam orbit; and
thermoelectron supply controlling means positioned between said thermoelectron beam emitting source and said ion beam orbit and being elongated along the deflection direction for controlling the supply of the thermoelectron beam emitted from the thermoelectron beam emitting source to the specified ion beam so as to neutralize the specified ion beam travelling along the ion beam orbit.

8. An ion beam irradiating apparatus as claimed in claim 7, wherein said thermoelectron supply controlling means entirely surrounds said specified ion beam travelling along the ion beam orbit.

9. An ion beam irradiating apparatus as claimed in claim 8, further comprising:
thermoelectron energy controlling means positioned between said ion beam orbit and said thermoelectron supply controlling means, and entirely surrounding said specified ion beam travelling along said ion beam orbit, for controlling the energy of the thermoelectron beam supplied from the thermoelectron beam emitting source to the specified ion beam travelling along the ion beam orbit.

10. An ion beam irradiating apparatus as claimed in claim 7, further comprising:
thermoelectron energy controlling means positioned between said thermoelectron supply controlling means and said ion beam orbit for controlling the energy of the thermoelectron beam supplied from the thermoelectron beam emitting source to the specified ion beam travelling along the ion beam orbit.

11. An ion beam irradiating apparatus as claimed in claim 7, wherein said thermoelectron beam emitting source is made of a boride of a rare-earth element.

12. An ion beam irradiating apparatus as claimed in claim 7, wherein said thermoelectron beam emitting source is made of an oxide of a rare-earth element.

13. An ion beam irradiating apparatus as claimed in claim 7, wherein said thermoelectron beam emitting source is a wire filament.

14. An ion beam irradiating apparatus as claimed in claim 7, wherein said thermoelectron beam emitting source is a rectangular tantalum plate.

15. The ion beam irradiating apparatus of claim 7, wherein said thermoelectron beam emitting source and thermoelectron supply controlling means are positioned to extend in planes opposed to the plane formed by the locus of displacement by deflection of the ion beam of the specified ion beam.

16. The ion beam irradiating apparatus of claim 7, further comprising electron shield electrode means arranged around an outer peripheral side of the ion neutralizer means to prevent outward heat irradiation from the filament means away from the specified ion beam.

17. The ion beam irradiating apparatus of claim 1, further comprising shielding means disposed between the sample holding means and the thermoelectron beam emitting source to prevent radiation heat from the thermoelectron beam emitting source from radiating towards the sample holding means.

* * * * *